(12) United States Patent
Chen et al.

(10) Patent No.: US 9,196,524 B2
(45) Date of Patent: Nov. 24, 2015

(54) MANUFACTURING METHOD OF SEMICONDUCTOR DEVICE

(75) Inventors: Chieh-Te Chen, Kaohsiung (TW); Yi-Po Lin, Tainan (TW); Jiunn-Hsiung Liao, Tainan (TW); Feng-Yi Chang, Tainan (TW); Shang-Yuan Tsai, Kaohsiung (TW)

(73) Assignee: UNITED MICROELECTRONICS CORP., Science-Based Industrial Park, Hsin-Chu (TW)

( * ) Notice: Subject to any disclaimer, the term of this patent is extended or adjusted under 35 U.S.C. 154(b) by 82 days.

(21) Appl. No.: 13/609,213

(22) Filed: Sep. 10, 2012

(65) Prior Publication Data

US 2014/0073104 A1 Mar. 13, 2014

(51) Int. Cl.
*H01L 21/336* (2006.01)
*H01L 21/768* (2006.01)
*H01L 21/311* (2006.01)

(52) U.S. Cl.
CPC .... *H01L 21/76816* (2013.01); *H01L 21/31144* (2013.01); *H01L 21/76895* (2013.01); *H01L 2924/0002* (2013.01)

(58) Field of Classification Search
USPC .................................................. 438/299, 637
See application file for complete search history.

(56) References Cited

U.S. PATENT DOCUMENTS

2008/0116496 A1* 5/2008 Tzeng et al. ................... 257/296
2009/0072228 A1* 3/2009 Choi et al. ...................... 257/40
2013/0001786 A1* 1/2013 Engel et al. .................... 257/761

* cited by examiner

*Primary Examiner* — Alexander Ghyka
(74) *Attorney, Agent, or Firm* — Winston Hsu; Scott Margo

(57) ABSTRACT

A manufacturing method of a semiconductor device is disclosed in the present invention. First, at least one gate structure and plurality of source/drain regions on a substrate are formed, a dielectric layer is then formed on the substrate, a first contact hole and a second contact hole are formed in the dielectric layer, respectively on the gate structure and the source/drain region, and a third contact hole is formed in the dielectric layer, wherein the third contact hole overlaps the first contact hole and the second contact hole.

10 Claims, 6 Drawing Sheets

MANUFACTURING METHOD OF SEMICONDUCTOR DEVICE

BACKGROUND OF THE INVENTION

1. Field of the Invention

The present invention relates to semiconductor manufacturing process, and more particularly to a connection method for contact holes.

2. Description of the Prior Art

Photolithography processes have been used as essential processes in semiconductor manufacturing procedures. They includes steps of providing a photomask or photomasks having designed patterns such as circuit patterns, doped region patterns, or contact layout patterns and transferring said patterns to a photoresist formed on a substrate by an exposure step and a development step so that those complicated patterns are obtained on the semiconductor chips or on the thin film precisely. After a photolithography process has been carried out, corresponding implantations or etching processes are performed to construct intricate circuit structures.

However, when two or more contact holes are partially overlap in the same thin film, the overlapped regions may be etched several times, thereby influencing the pattern contours, and moreover, damaging others components disposed under the contact plug.

SUMMARY OF THE INVENTION

To solve the issues mentioned above, the present invention provides a manufacturing method including forming at least one gate structure and plurality of source/drain regions on a substrate. A dielectric layer is then formed on the substrate. Afterwards, a first contact hole and a second contact hole are formed in the dielectric layer, on the gate structure and the source/drain region respectively, and a third contact hole is formed in the dielectric layer, wherein the third contact hole overlaps the first contact hole and the second contact hole.

The present invention further provides a manufacturing method including forming at least one gate structure and plurality of source/drain regions on a substrate. A dielectric layer is then formed on the substrate. Afterwards, a first contact hole is formed in the dielectric layer, in the gate structure or in the source/drain region, and a second contact hole is formed in the dielectric layer, wherein the second contact hole overlaps the first contact hole and the second contact hole.

With the method of the present invention, since less overlapped regions are present during the formation of the contact holes, the destruction to the components under each contact holes can be avoided, thereby increasing the process yield rate.

These and other objectives of the present invention will no doubt become obvious to those of ordinary skill in the art after reading the following detailed description of the preferred embodiment that is illustrated in the various figures and drawings.

DETAILED DESCRIPTION

To provide a better understanding of the present invention to users skilled in the technology of the present invention, preferred embodiments are detailed as follows. The preferred embodiments of the present invention are illustrated in the accompanying drawings with numbered elements to clarify the contents and the effects to be achieved.

Please note that the figures are only for illustration and the figures may not be to scale. The scale may be further modified according to different design considerations. When referring to the words "up" or "down" that describe the relationship between components in the text, it is well known in the art and should be clearly understood that these words refer to relative positions that can be inverted to obtain a similar structure, and these structures should therefore not be precluded from the scope of the claims in the present invention.

Figure 1:
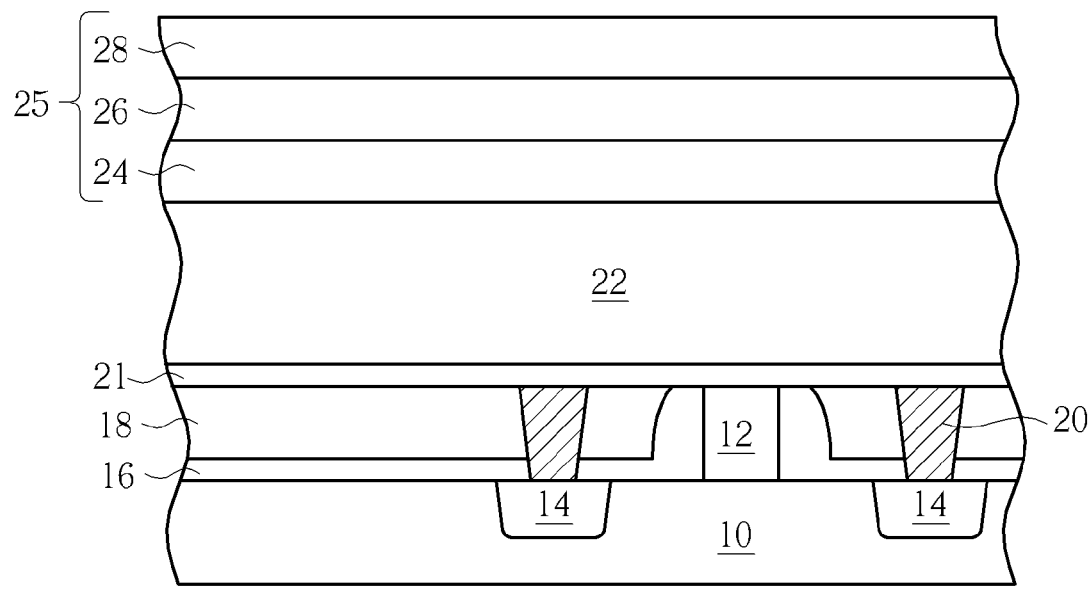
FIGS. 1-7 are schematic, cross-sectional view diagrams showing a method for fabricating a semiconductor device according to one embodiment of the present invention.

Please refer to FIGS. 1-7. FIGS. 1-7 are schematic, cross-sectional view diagrams showing a method for fabricating a semiconductor device according to the first preferred embodiment of the present invention. As shown in FIG. 1, at first, a substrate 10 is provided, such as a silicon substrate, an epitaxial silicon substrate, a silicon germanium substrate, a silicon carbide substrate or a silicon-on-insulator (SOI) substrate. A semiconductor device is formed on the substrate 10, such as a metal oxide semiconductor (MOS) transistor, and the MOS transistor includes a gate structure 12 and a plurality of S/D region 14 disposed on two sides of the gate structure 12 in the substrate 10. Afterwards, a contact etch stop layer (CESL)16 and a dielectric layer, such as a bottom inter layer dielectric (ILD) 18 are sequentially formed on the substrate 10, a planarization process is then carried out, such as a chemical mechanical polishing, to remove parts of the bottom ILD 18 and exposes the gate structure 12. The gate structure 12 may be a metal gate, a polysilicon gate or others, but not limited thereto. Besides, a contact structure 20 may be selectively formed on the corresponded S/D region 14, penetrating the bottom ILD 18 and the CESL 16, wherein the contact structure 20 may be a pole contact or a slot contact that directly contacts the S/D region 14.

Afterwards, a top ILD 22 and a photoresist layer 25 are sequentially formed on the bottom ILD 18. It is worth noting that, in the first preferred embodiment of the present invention, a cap layer 21 may be selectively formed between the top ILD 22 and the bottom ILD 18, such as a nitrogen doped carbide (NDC), and the cap layer is used as an etching stop layer. In addition, the photoresist layer 25 may be a single photoresist layer structure or a multiple photoresist layer structure. In this embodiment, the photoresist layer 25 is a multiple photoresist layer structure; for example, a bottom photoresist 24 and a middle photoresist 26 are selectively formed on the top ILD 22, a top photoresist 28 is then formed on the middle photoresist 26. The multiple photoresist layer structure can improve the quality of the contact holes formed in the top ILD 22 in following steps. In other words, when performing an etching process through multiple photoresist layer structures, the pattern can be transferred from one layer to another, contrary to using a single photoresist layer structure. This way the pattern alignment is more precise, and defects are less likely to occur in the contact holes, but the present invention is not limited thereto, and the photoresist layer 25 can also be a single photoresist layer.

In the present invention, the bottom photoresist 24 may be a positive photoresist or a negative photoresist and include an organic material, such as an I-line photoresist layer, the thickness is preferred to be comprised between 1500~2500 Angstrom. As known by persons of ordinary skills in the art, the I-line photoresist layer is more sensitive to a wave of a wavelength of 365 nm. The middle photoresist 26 may be a silicon-containing hard-mask bottom anti-reflection coating layer (SHB), including an organosilicon polymer or a polysilane, which thickness is preferred to be comprised between 300~700 Angstrom. The top photoresist 28 may be a positive photoresist or a negative photoresist, such as an ArF photoresist layer to be used for exposures with a 193 nm wavelength, which thickness is preferred to be comprised between 500~1000 Angstrom.

Figure 2:
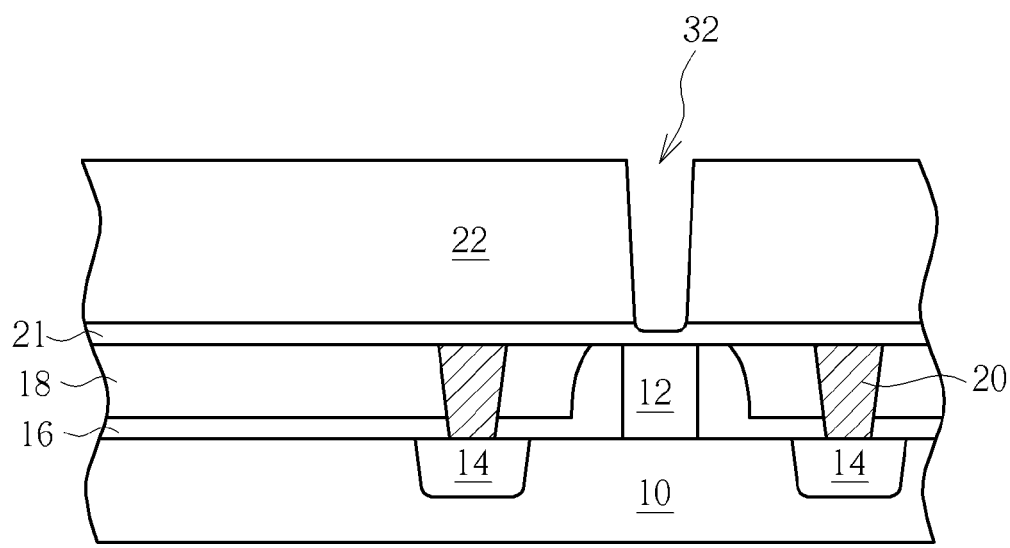
Figure 3:
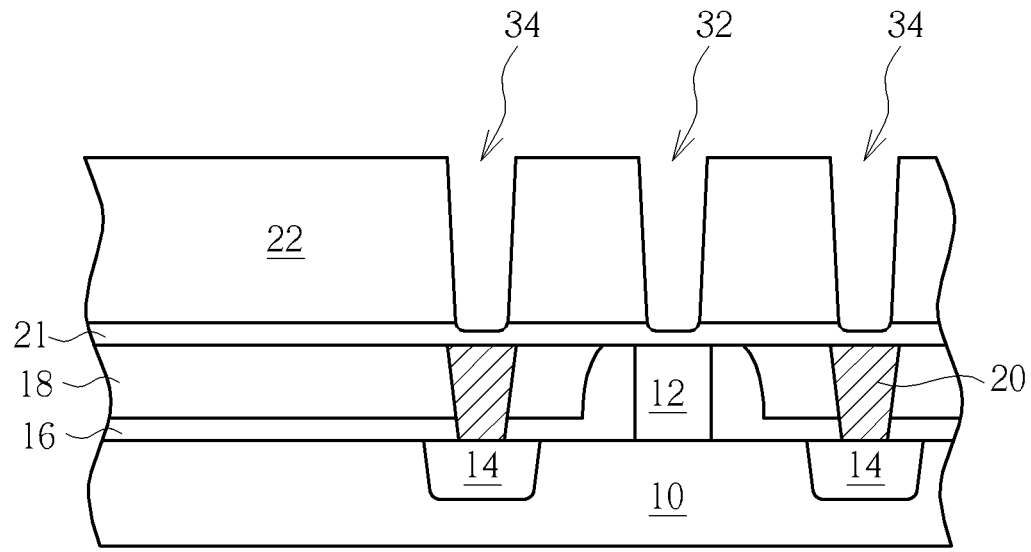

A photo-etching process is then performed with a first photomask, i.e. exposing and developing the top photoresist 28. The middle photoresist 26, the bottom photoresist 24 and the top ILD 22 are then etched. After the photoresist layer 25 is removed, as shown in FIG. 2, a first contact hole 32 is formed in the top ILD 22, wherein the first contact hole 32 is disposed above the gate structure 12, and exposing the cap layer 21. Repeat the processes of forming the bottom photoresist (not shown), the middle photoresist (not shown) and the top photoresist (not shown) on the top ILD 22, then exposing and developing the top photoresist with a second photomask. The middle photoresist, the bottom photoresist and the top ILD 22 are then etched sequentially. After the photoresist layer is removed, as shown in FIG. 3, a second contact hole 34 is formed in the top ILD 22, wherein the second contact hole 34 is disposed above the S/D region 14. Because the contact structure 20 may be disposed on the S/D region 14, hence the second contact hole 34 may expose the S/D region 14 or the contact structure 20 during subsequent etching processes. It is worth noting that, in this present embodiment, the first contact hole 32 does not directly contact the second contact hole 34.

Figure 4:
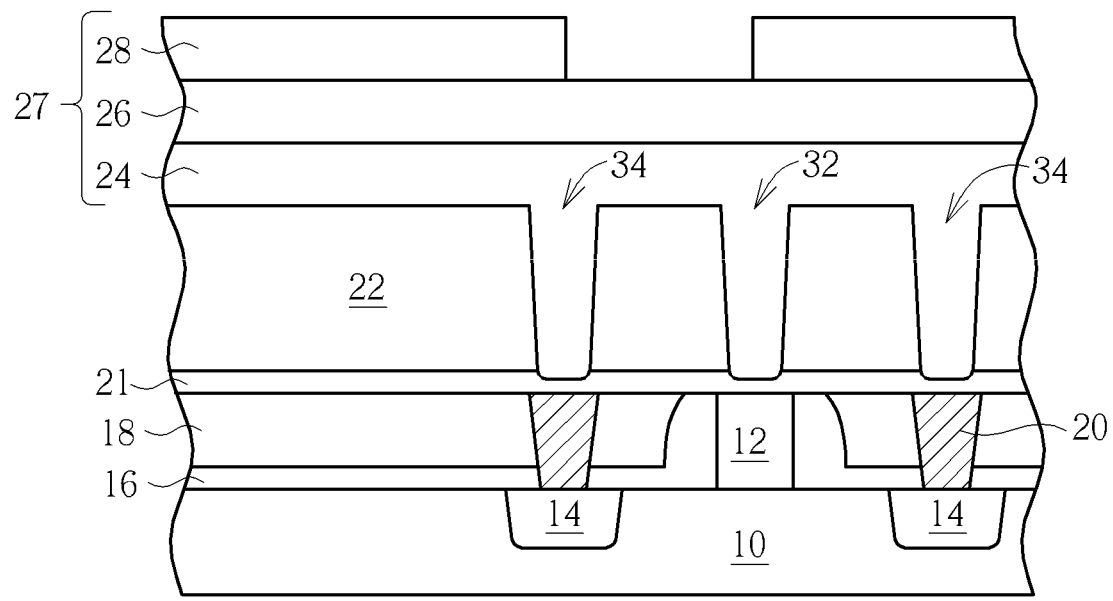
Figure 5:
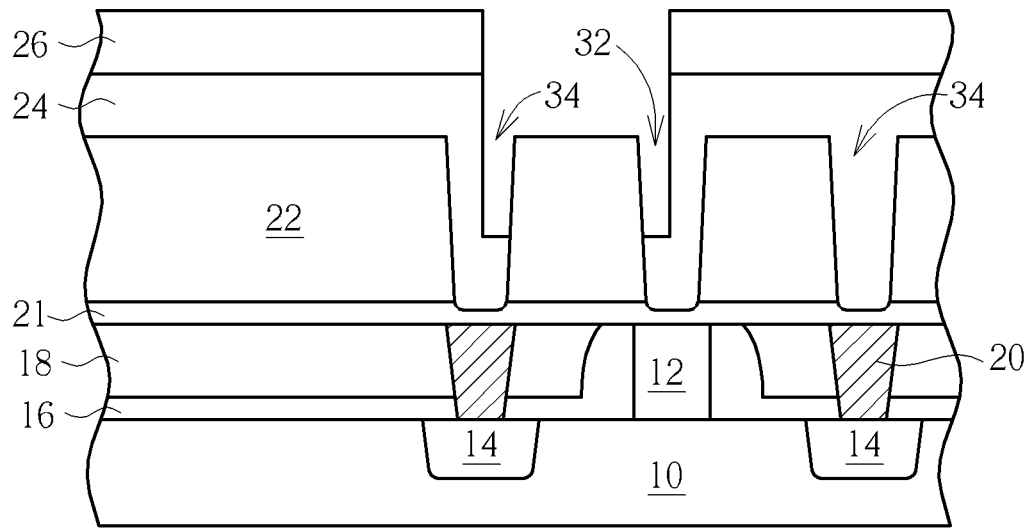
Figure 6:
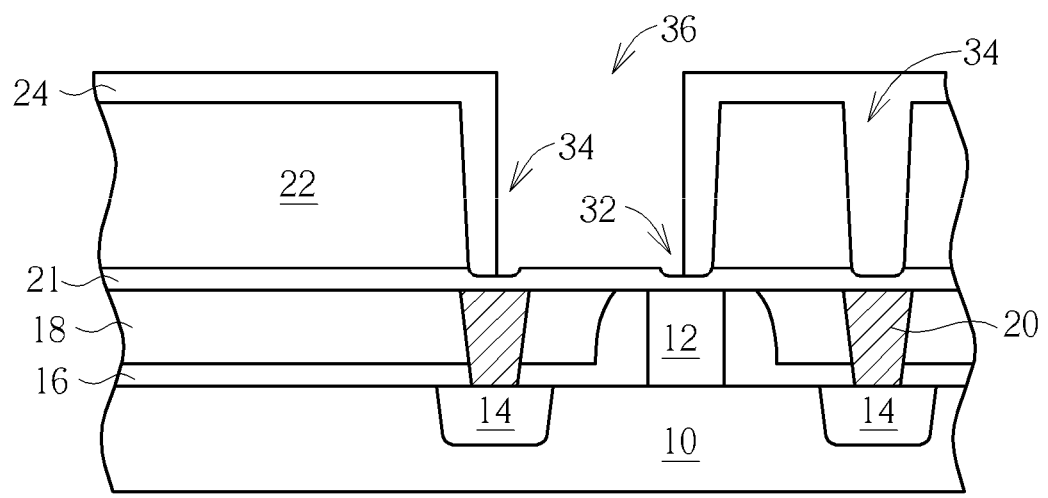
Figure 7:
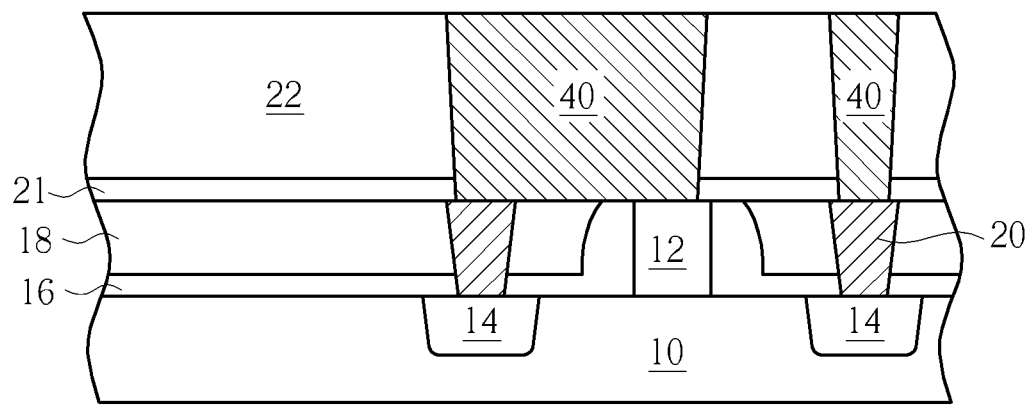

Afterwards, repeat the process for forming a third contact hole, as shown in FIG. 4: a photoresist layer 27, such as the bottom photoresist 24, the middle photoresist 26 and the top photoresist 28 are formed on the top ILD 22, then expose and develop the top photoresist 28 with a third photomask, as shown in FIG. 5; the middle photoresist 26, the bottom photoresist 24 and the top ILD 22 are etched sequentially, and the rest of the middle photoresist 26, and the cap layer 21 or the top ILD 22 disposed in each contact holes are removed, as shown in FIG. 6; a third contact hole 36 is formed in the top ILD 22 between the first contact hole 32 and the second contact hole 34, wherein the third contact hole 36 overlaps parts of the first contact hole 32 and parts of the second contact hole 34 respectively. After the bottom photoresist 24 and the cap layer 21 disposed in each contact holes are removed, as shown in FIG. 7, a barrier layer (not shown) and a conductive layer 40 such as a metal layer, for example tungsten (W), aluminum (Al) or copper (Cu), are filled in each contact holes. A planarization process is then performed optionally to planarize the conductive layer 40. The conductive layer 40 electrically connects the gate structure 12 to the contact structure 20 or the S/D region 14. Finally, a multi-layer metal interconnect process is performed, to form the needed metal interconnects (not shown) on the top ILD 22, such as a first metal trace, a second metal trace . . . and an $n^{th}$ metal trace.

Figure 8:
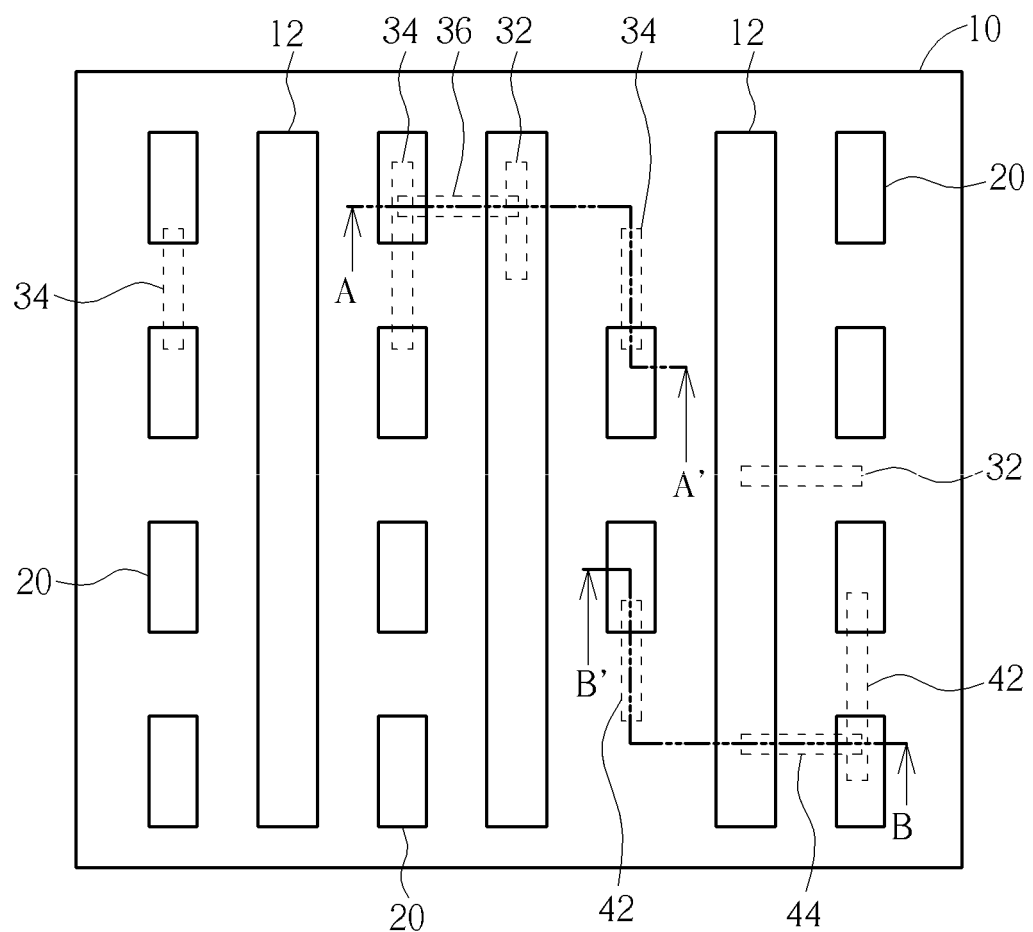
FIG. 8 is a schematic, top-view diagram showing a semiconductor device according to the first preferred embodiment of the present invention.

FIG. 8 illustrates the top-view diagram of the present embodiment, as shown in FIG. 8, each contact structure 20 are slot contacts for instance, in this embodiment, a plurality of first contact holes 32 are formed on the gate structure 12, and each second contact holes 34 are formed on each contact structures 20 or on each S/D regions 14, and a plurality of third contact holes 36 are formed to connect the first contact hole 32 and the second contact hole 34, wherein the areas of the first contact hole 32 and of the second contact hole 34 are not limited as shown in FIG. 8, the width or the length may be larger than the gate structure 12 or the contact structure 20. The feature of the present invention is that the third contact hole 36 is formed after the first contact hole 32 and the second contact hole 34 is formed, besides, the first contact hole 32 does not directly contacts the second contact hole 34 during the forming process, therefore the first contact hole 32 does not overlap the second contact hole 34, and the third contact hole 36 connects the first contact hole 32 with the second contact hole 34, thereby, it avoids the overlapped region of each contact holes being etched for several times during the etching process, causing the damages or destruction of the components disposed under each contact holes, such as the gate structure 12 or the contact structure 20. It is worth noting that some of the first contact holes 32 and the second contact holes 34 do not overlap the third contact hole 36. The cross section of the cross line AA' corresponds to the FIGS. 1-7, showing the fabricating method for the semiconductor device of the present invention. The cross section of the cross line BB' corresponds to the FIGS. 9-12, showing the fabricating method according to the second preferred embodiment of the present invention.

In the embodiment mentioned above, the first contact hole 32 is formed before the second contact hole 34 is formed, but the present invention is not limited thereto, in other words, the second contact hole 34 can be formed before the first contact hole 32 is formed, or the first contact hole 32 and the second contact hole 34 are formed simultaneously. More detail to describe, in this present invention, the first contact hole 32 and the second contact hole 34 aligned along with a first direction are formed through a double patterning lithography (DPL), exposing and developing the photoresist layer above the gate structure 12, then etching the top ILD 22 above the gate structure 12, afterward, exposing and developing the photoresist layer above the S/D region 14, and etching the top ILD 22 above the S/D region 14, in this case, there are two photo-etching processes and two etching processes (2P2E). On the other hand, the present invention may includes exposing and developing the photoresist layer above the gate structure 12, then exposing and developing the photoresist layer above the S/D region 14, afterward, an etching process is performed only once, so there are two photo-etching processes and just one etching process (2P1E). And each of the third contact holes 36 are aligned with a second direction to connect the first contact hole 32 and the second contact hole 34, wherein the first direction is not parallel with the second direction. It can be understandable that the present invention is not limited by these process mentioned above. If the following conditions are satisfied, any process should be comprised in the scope of the present invention: the first contact hole 32 does not directly contact the second contact hole 34, and the third contact hole 36 formed in later steps overlaps the first contact hole 32 and the second contact hole 34.

Besides, the cap layer 21 of the present invention can be used as the stop layer during the etching process, to protect the components such as the gate structure 12 or the contact structure 20 from the destruction. Therefore, in this embodiment, during the formation of first contact hole 32, the second contact hole 34 and the third contact hole 36, the etching process can stopped on the cap layer 21, and after the first contact hole 32, the second contact hole 34 and the third contact hole 36 are completed, the cap layer 21 is then removed, such as through a wet etching process, to expose the gate structure 12, the S/D region 14 or the contact structure 20 disposed in each contact holes, but the method mentioned above is not limited thereto. The present invention can be used in other semiconductor manufacturing process, for example, to form via plug or traces in a metal interconnect.

To summarize the above descriptions, the present invention provides a semiconductor manufacturing process, the first contact hole and the second contact hole are electrically connected to the gate structure and the S/D region respectively, and both of them are connected to each other through the third contact hole, and since less overlapped regions are present during the formation of the contact holes, the destruction to the components under each contact holes can be avoided, thereby increasing the process yield rate.

The following description will detail the different embodiments of the semiconductor device and the manufacturing method of the present invention. To simplify the description, the following description will detail the dissimilarities among the different embodiments and the identical features will not be redundantly described. In order to easily compare the differences between the embodiments, the identical components in each of the following embodiments are marked with identical symbols.

Figure 9:
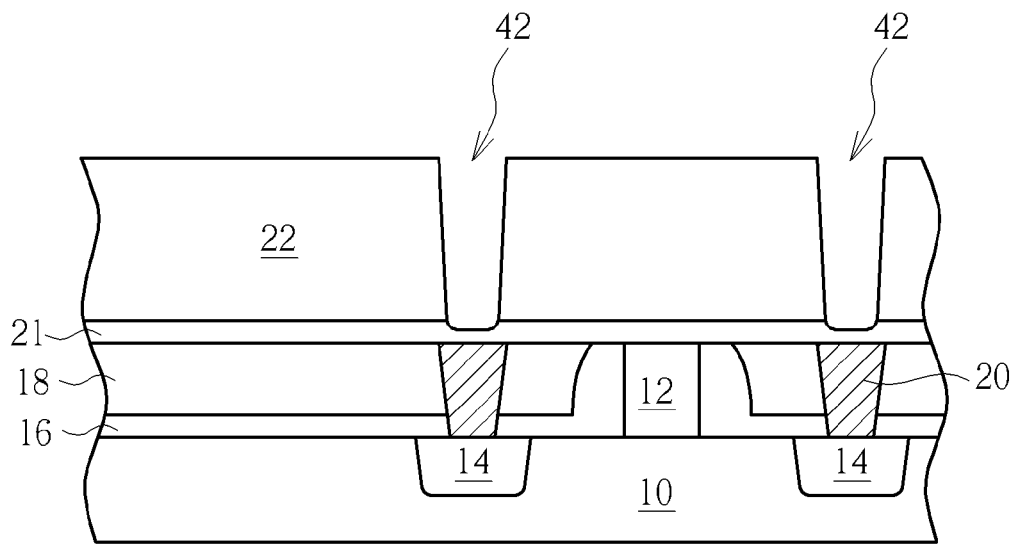
FIGS. 9-12 are schematic, cross-sectional view diagrams showing a method for fabricating a semiconductor device according to the second preferred embodiment of the present invention.
Figure 10:
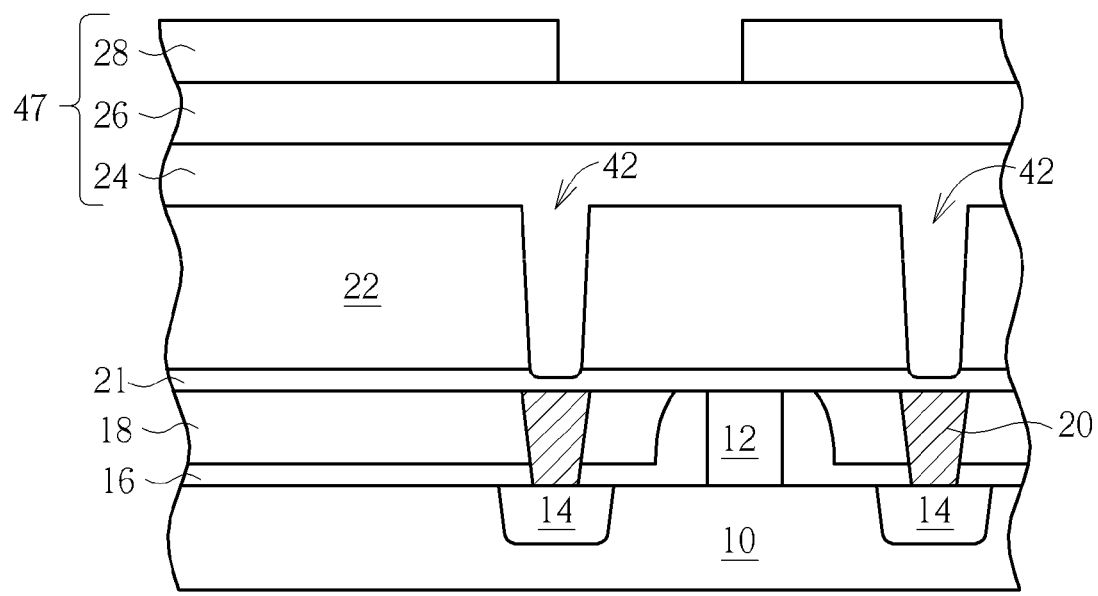
Figure 11:
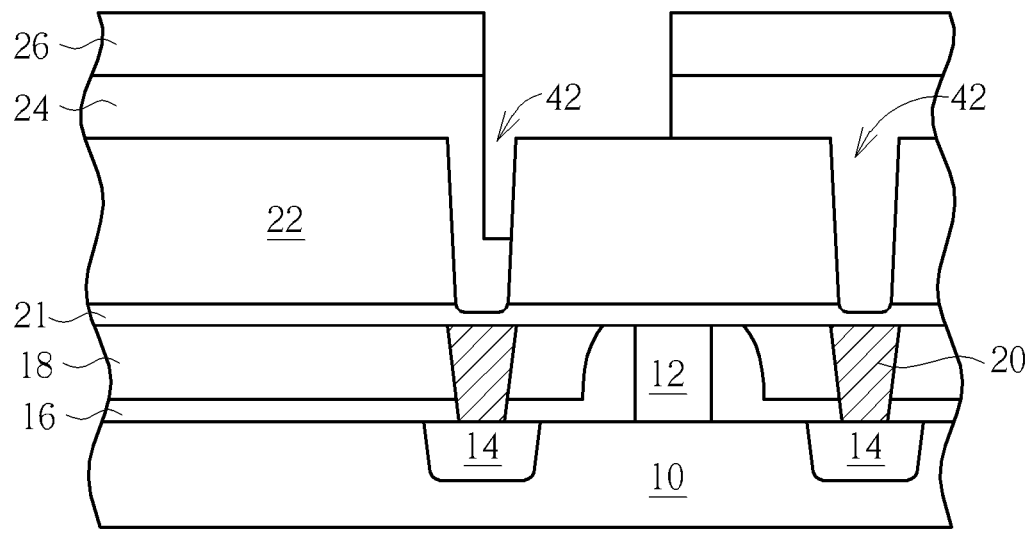
Figure 12:
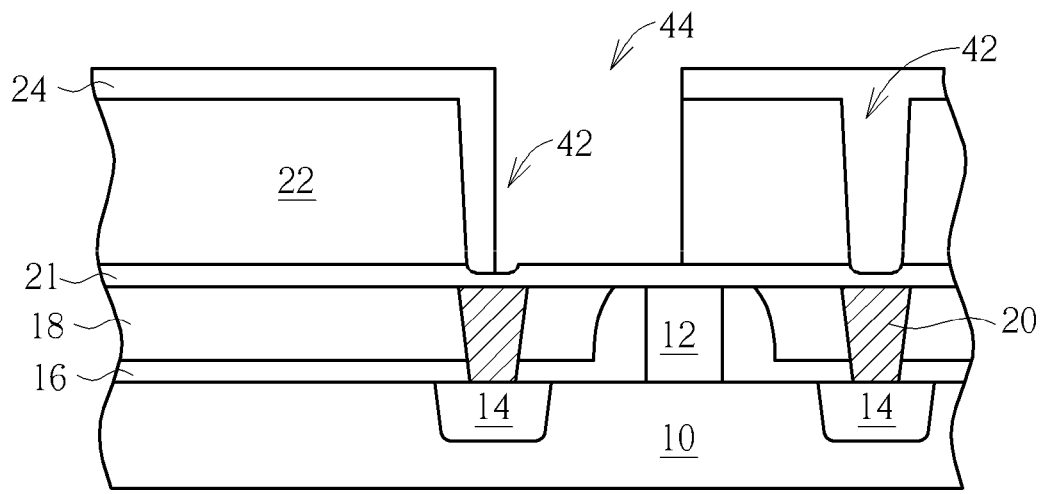

Please refer to FIGS. 9~12, FIGS. 9-12 are schematic, cross-sectional view diagrams showing a method for fabricating a semiconductor device according to the second preferred embodiment of the present invention. The fabrication process of this second embodiment is similar to the first embodiment; hence, the following description is focused on the difference between these two embodiments. First, a semiconductor device with a contact structure 20 disposed on each corresponding source/drain region 14 as shown in FIG. 1 is provided. Afterwards, as shown in FIG. 9, a first contact hole 42 is formed in the top ILD 22 with a first photomask, wherein the first contact hole 42 is disposed above the source/drain region 14, as shown in FIG. 10, a photoresist layer 27, such as a bottom photoresist 24, a middle photoresist 26 and a top photoresist 28 are formed on a top ILD 22, then the top photoresist 28 is exposed and developed with a second photomask. As shown in FIG. 11, the middle photoresist 26, the bottom photoresist 24 and the top ILD 22 are etched sequentially, and after the rest of the middle photoresist 26, a cap layer 21 or the top ILD 22 disposed in each contact holes are removed, as shown in FIG. 12, a second contact hole 44 is formed in the top ILD 22, wherein the second contact hole 44 overlaps parts of the first contact hole 42. A conductive layer (not shown) is then formed in the first contact hole 42 and the second contact hole 44. The other components, material properties, and manufacturing method of the embodiment are similar to those of the first preferred embodiment detailed above and will not be redundantly described.

The first contact hole 42 described above is formed above the source/drain region 14, but not limited thereto. In other words, the first contact hole 42 may formed above the gate structure 12. The difference between the second preferred embodiment and the first preferred embodiment is that the first contact hole 42 is only formed above the source/drain region 14 or the gate structure 12, and the gate structure 12 and the source/drain region 14 (or the contact structure 20) are connected to each other through the second contact hole 44. Since less overlapped regions are present during the formation of the contact holes, the destruction to the components under each contact holes can be avoided, thereby increasing the process yield rate.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A manufacturing method of a semiconductor device, comprising:
    forming at least one gate structure and plurality of source/drain regions on a substrate;
    forming a dielectric layer on the substrate;
    forming a first contact hole and a second contact hole in the dielectric layer, on the gate structure and the source/drain region respectively;
    forming a photoresist layer in the first contact hole and the second contact hole; and
    patterning the photoresist layer and removing a portion of the dielectric layer between the first contact hole and the second contact hole to form a third contact hole in the dielectric layer, wherein the third contact hole is formed after the first contact hole and the second contact hole are formed, and the third contact hole overlaps the first contact hole and the second contact hole, the first contact hole and the second contact hole not contacting each other before the third contact hole is formed.

2. The manufacturing method of claim 1, wherein the first contact hole and the second contact hole are formed during different steps.

3. The manufacturing method of claim 1, wherein the first contact hole and the second contact hole are formed during a same step.

4. The manufacturing method of claim 1, further comprising forming a contact structure on each corresponding source/drain region respectively.

5. The manufacturing method of claim 1, wherein the contact structure includes pole contacts or slot contacts.

6. The manufacturing method of claim 1, wherein the first contact hole, the second contact hole and the third contact hole are formed in the dielectric layer through a photo-etching process.

7. The manufacturing method of claim 1, further comprising forming a conductive layer in the first contact hole, the second contact hole and the third contact hole.

8. The manufacturing method of claim 1, wherein the gate structure includes poly gate and metal gate.

9. The manufacturing method of claim 1, wherein the third contact hole is formed after the first contact hole and the second contact hole is formed.

10. The manufacturing method of claim 1, further comprising filling a conductive layer in the first contact hole, the second contact hole and the third contact hole simultaneously.

* * * * *